United States Patent
Wang

(10) Patent No.: US 12,113,111 B2
(45) Date of Patent: Oct. 8, 2024

(54) SEMICONDUCTOR STRUCTURE INCLUDING GATE STRUCTURE INCLUDING BARRIER LAYER AND CONDUCTIVE LAYER AND MANUFACTURING METHOD THEREOF

(71) Applicant: CHANGXIN MEMORY TECHNOLOGIES, INC., Hefei (CN)

(72) Inventor: Chuyu Wang, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 412 days.

(21) Appl. No.: 17/470,090

(22) Filed: Sep. 9, 2021

(65) Prior Publication Data
US 2022/0102515 A1    Mar. 31, 2022

Related U.S. Application Data

(63) Continuation of application No. PCT/CN2021/103894, filed on Jun. 30, 2021.

(30) Foreign Application Priority Data

Sep. 28, 2020 (CN) .......................... 202011042965.9

(51) Int. Cl.
    *H01L 21/00*     (2006.01)
    *H01L 21/3215*     (2006.01)
    *H01L 29/40*     (2006.01)
    *H01L 29/423*     (2006.01)

(52) U.S. Cl.
    CPC ...... *H01L 29/4236* (2013.01); *H01L 21/3215* (2013.01); *H01L 29/401* (2013.01)

(58) Field of Classification Search
CPC .......... H01L 29/4236; H01L 29/42364; H01L 29/401; H10L 21/3215
See application file for complete search history.

(56) References Cited

U.S. PATENT DOCUMENTS

| | | | |
|---|---|---|---|
| 5,970,378 A | 10/1999 | Shue | |
| 9,853,031 B1* | 12/2017 | Cho | ..................... H10B 12/34 |
| 10,211,211 B1 | 2/2019 | Chang et al. | |
| 10,608,093 B2 | 3/2020 | Wu et al. | |
| 2005/0112876 A1 | 5/2005 | Wu | |

(Continued)

FOREIGN PATENT DOCUMENTS

| | | |
|---|---|---|
| CN | 105655252 A | 6/2016 |
| CN | 108346666 A | 7/2018 |
| CN | 109755244 A | 5/2019 |

*Primary Examiner* — Reema Patel
(74) *Attorney, Agent, or Firm* — Kilpatrick Townsend & Stockton LLP

(57) ABSTRACT

A semiconductor structure and a manufacturing method thereof are provided, which relates to the field of the semiconductor. The method of manufacturing the semiconductor structure includes: providing a substrate; forming a gate trench on the substrate; forming a barrier layer at least covering the inner wall of the gate trench in the gate trench; removing chloride ions remaining in the barrier layer by a plasma ion implantation, and forming a first barrier layer and a second barrier layer by the barrier layer, the concentration of nitrogen ions in the first barrier layer is different from the concentration of nitrogen ions in the second barrier layer; and forming a gate structure in the gate trench.

16 Claims, 8 Drawing Sheets

(56) References Cited

U.S. PATENT DOCUMENTS

2016/0196980 A1\* 7/2016 Degai .................. H01L 29/458
                                              438/597
2018/0212030 A1   7/2018 Wu et al.
2020/0185505 A1   6/2020 Wu et al.

\* cited by examiner

SEMICONDUCTOR STRUCTURE INCLUDING GATE STRUCTURE INCLUDING BARRIER LAYER AND CONDUCTIVE LAYER AND MANUFACTURING METHOD THEREOF

CROSS-REFERENCE TO RELATED APPLICATION

This is a continuation application of International Patent Application No. PCT/CN2021/103894, filed on Jun. 30, 2021, which claims priority to Chinese patent application No. 202011042965.9, filed on Sep. 28, 2020 and entitled "Semiconductor Structure and Manufacturing Method thereof". The disclosures of International Patent Application No. PCT/CN2021/103894 and Chinese patent application No. 202011042965.9 are incorporated by reference herein in their entireties.

TECHNICAL FIELD

This disclosure relates to the field of the semiconductor, and particularly relates to a semiconductor structure and a manufacturing method thereof.

BACKGROUND

A transistor generally includes a substrate and a gate trench arranged on the substrate. A gate insulating layer, a barrier layer and a gate structure are stacked in the gate trench. When the barrier layer is manufactured, a chemical vapor deposition process is generally used to deposit titanium chloride and ammonia gas in the gate trench, and the titanium chloride reacts with the ammonia gas to form titanium nitride.

However, during the formation of the titanium nitride, if the reaction between the titanium nitride and the ammonia gas is insufficient, chloride ions will remain in the barrier layer. The chloride ions will result in an increase in the resistance of the gate structure formed in the gate trench, and a decrease in the performance of the semiconductor structure.

SUMMARY

A first aspect of the embodiments of this disclosure provides a method of manufacturing a semiconductor structure, in which:

a substrate is provided;

a gate trench is formed on the substrate;

a barrier layer at least covering the inner wall of the gate trench is formed in the gate trench;

chloride ions remaining in the barrier layer are removed by a plasma ion implantation, a first barrier layer and a second barrier layer are formed by the barrier layer, and the concentration of nitrogen ions in the first barrier layer is different from the concentration of nitrogen ions in the second barrier layer; and a gate structure is formed in the gate trench.

A second aspect of the embodiments of this disclosure provides a semiconductor structure, including a substrate, a gate trench, a barrier layer and a conductive layer. The gate trench is arranged in the substrate. The barrier layer covers the inner wall of the gate trench, and no chloride ions remain in the barrier layer.

The barrier layer includes a first barrier layer and a second barrier layer, and the concentration of nitrogen ions in the first barrier layer is different from the concentration of nitrogen ions in the second barrier layer. The conductive layer covers the surface of the barrier layer, and the barrier layer and the conductive layer form a gate structure.

DETAILED DESCRIPTION

The applicant in this disclosure found in the actual work process that if chloride ions exist in the barrier layer of the semiconductor structure, the chloride ions will cause defects in the gate structure, thereby increasing the resistance of the gate structure and reducing the performance of the semiconductor structure.

In view of the above technical problems, the embodiments of this disclosure provide a semiconductor structure and a manufacturing method thereof. The chloride ions remaining in the barrier layer are removed by the plasma ion implantation to prevent formation of defects inside the gate structure, thereby reducing the resistance of the gate structure and improving the performance of the semiconductor structure.

In addition, in the process of removing the chloride ions remaining in the barrier layer by the plasma ion implantation, a first barrier layer and a second barrier layer may also be formed by the barrier layer, and the concentration of nitrogen ions in the first barrier layer is different from the concentration of nitrogen ions in the second barrier layer. Compared with the situation before ion implantation, the concentration of nitrogen ions in at least a part of the barrier layer is increased, which can improve the barrier ability of the barrier layer to prevent the conductive layer in the gate structure from diffusing into the substrate, thereby improving the performance of the gate structure.

In order to make the above objectives, features and advantages of the embodiments of this disclosure more obvious and understandable, the technical solutions in the embodiments of this disclosure will be clearly and completely described below with reference to the drawings in the embodiments of this disclosure. It is apparent that the described embodiments are only a part of the embodiments of this disclosure, but are not all of the embodiments. Based on the embodiments in this disclosure, all other embodiments obtained by those skilled in the art without creative efforts fall within the protection scope of this disclosure.

Figure 1:
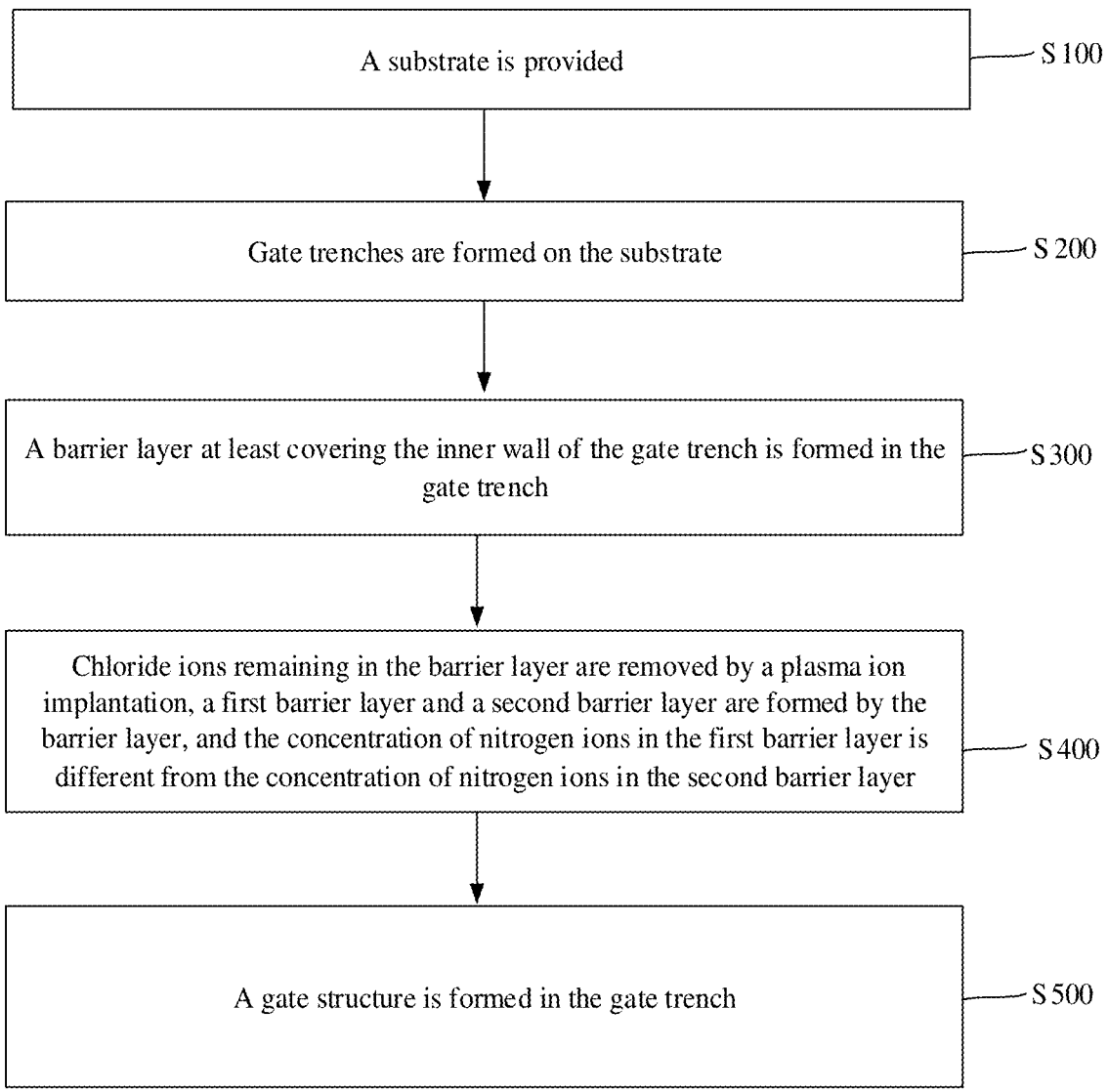
FIG. 1 is a flow chart of a method of manufacturing a semiconductor structure according to an embodiment of this disclosure.

As shown in FIG. 1, a method of manufacturing a semiconductor structure according to an embodiment of this disclosure includes the following operations.

In S100, a substrate is provided.

The substrate is used as a supporting component of the semiconductor structure to support other components arranged on it. The substrate may be made of a semiconductor material. For example, the semiconductor material may be one or more of silicon, germanium, silicon-germanium compounds and silicon-carbon compounds.

The substrate may have active regions and trench isolation structures for isolating the active regions from each other. A semiconductor structure may be formed in the active region of the substrate. The semiconductor structure may be a transistor or a memory.

In S200, at least one gate trench is formed on the substrate. In an example, a plurality of gate trenches may be formed in the substrate and spaced apart from each other.

Figure 2:
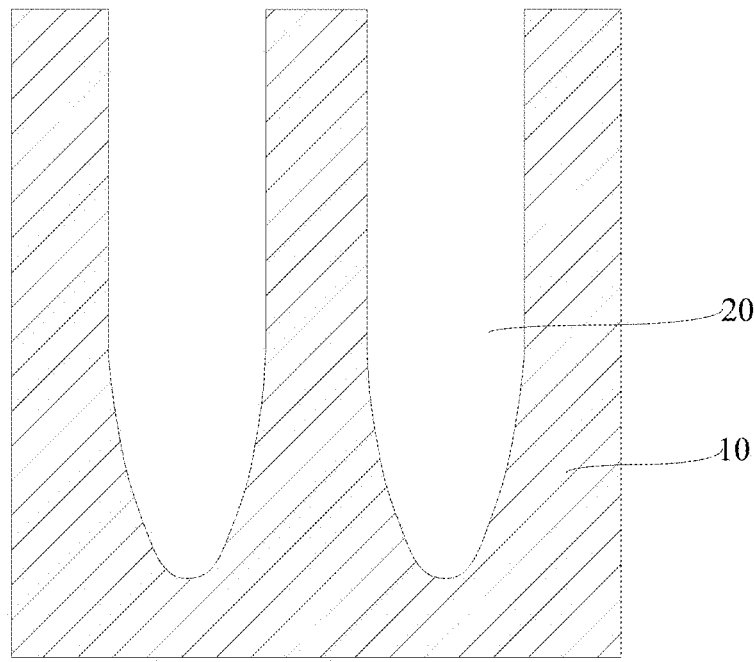
FIG. 2 is a schematic view showing the formation of gate trenches in a method of manufacturing a semiconductor structure according to an embodiment of this disclosure.

In this operation, gate trenches may be formed in the substrate, and the structure of the gate trench is shown in FIG. 2. A plurality of gate trenches 20 are formed in the substrate 10, and the plurality of gate trenches 20 are spaced apart from each other in the substrate 10.

The operation of forming the gate trenches 20 in the substrate 10 may be performed as follows. For example, a photoresist layer covering an upper surface of the substrate 10 may be formed on the substrate 10 by a coating-curing method, an inkjet printing method or a deposition method.

The photoresist layer is patterned by patterning processes, such as masking, exposure, developing and etching, to form a mask pattern. The mask pattern includes a plurality of shielding regions and a plurality of opening regions arranged alternately.

A part of the depth of the substrate 10 located in the opening regions is removed, and a plurality of gate trenches 20 spaced apart from each other are formed in the substrate 10.

To remove the photoresist layer, a cleaning process, such as an ultrasonic cleaning method or a plasma cleaning method, may be used to remove the photoresist layer to be removed, so as to form a plurality of gate trenches 20 arranged spaced apart from each other in the substrate 10.

In S300, a barrier layer at least covering the inner wall of the gate trench is formed in the gate trench.

Figure 3:
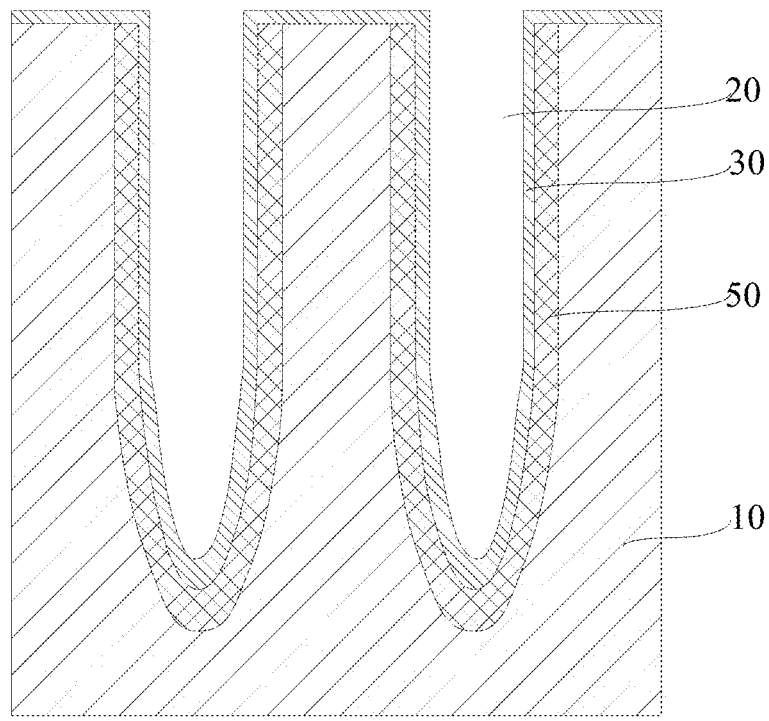
FIG. 3 is a schematic view showing the formation of a barrier layer in a method of manufacturing a semiconductor structure according to an embodiment of this disclosure.

In this operation, the barrier layer may cover the inner wall of the gate trench, and may also cover both the inner wall of the gate trench and the surface of the substrate located outside the gate trench. For example, as shown in FIG. 3, the barrier layer 30 covers the inner wall of the gate trench 20 and the surface of the substrate 10 located outside the gate trench 20.

The operation of forming the barrier layer 30 in the gate trench 20 may be performed as follows. For example, the barrier layer 30 is formed in the gate trench 20 by chemical vapor deposition or physical vapor deposition, and the barrier layer 30 may cover the surface of the gate trench 20 and cover the surface of the substrate 10 located outside the gate trench 20.

In this operation, it is also possible that, the barrier layer 30 may be formed in the gate trench 20 at first, and the barrier layer 30 may cover the surface of the substrate 10 outside the gate trench 20; and then, the barrier layer 30 covering the surface of the substrate 10 outside the gate trench 20 is removed by etching, and the barrier layer 30 located in the gate trench 20 is retained.

Further, after the operation of forming the gate trench in the substrate and before the operation of forming the barrier layer in the gate trench, the method further includes the follows: a gate insulating layer is formed in the gate trench. The gate insulating layer at least covers the inner wall of the gate trench to form the structure as shown in FIG. 3.

In this operation, the gate insulating layer 50 may cover the inner wall of the gate trench 20, and may also cover both the inner wall of the gate trench 20 and the surface of the substrate 10 located outside the gate trench 20. In this embodiment, the inner wall of the gate trench 20 may be understood as the side wall and bottom wall of the gate trench 20.

The expression "the gate insulating layer 50 covers the inner wall of the gate trench 20" is intended to indicate that a gate insulating layer 50 is arranged between the side wall of the gate trench 20 and the barrier layer 30 and also between the bottom wall of the gate trench 20 and the barrier layer 30, and the gate structure and the substrate 10 can be insulated form each other through the gate insulating layer 50.

The gate insulating layer 50 may be formed by a chemical vapor deposition or an atomic layer deposition, and the gate insulating layer 50 at least covers the inner wall of the gate trench 20. In other words, the shape of the gate insulating layer 50 conforms to the shape of the gate trench 20. For example, when the gate trench 20 is U-shaped, correspondingly, the gate insulating layer 50 is also U-shaped.

The material of the gate insulating layer 50 may be one or more of silicon oxide, silicon nitride and silicon oxynitride.

In S400, chloride ions remaining in the barrier layer are removed by a plasma ion implantation, a first barrier layer and a second barrier layer are formed by the barrier layer, and the concentration of nitrogen ions in the first barrier layer is different from the concentration of nitrogen ions in the second barrier layer.

Figure 4:
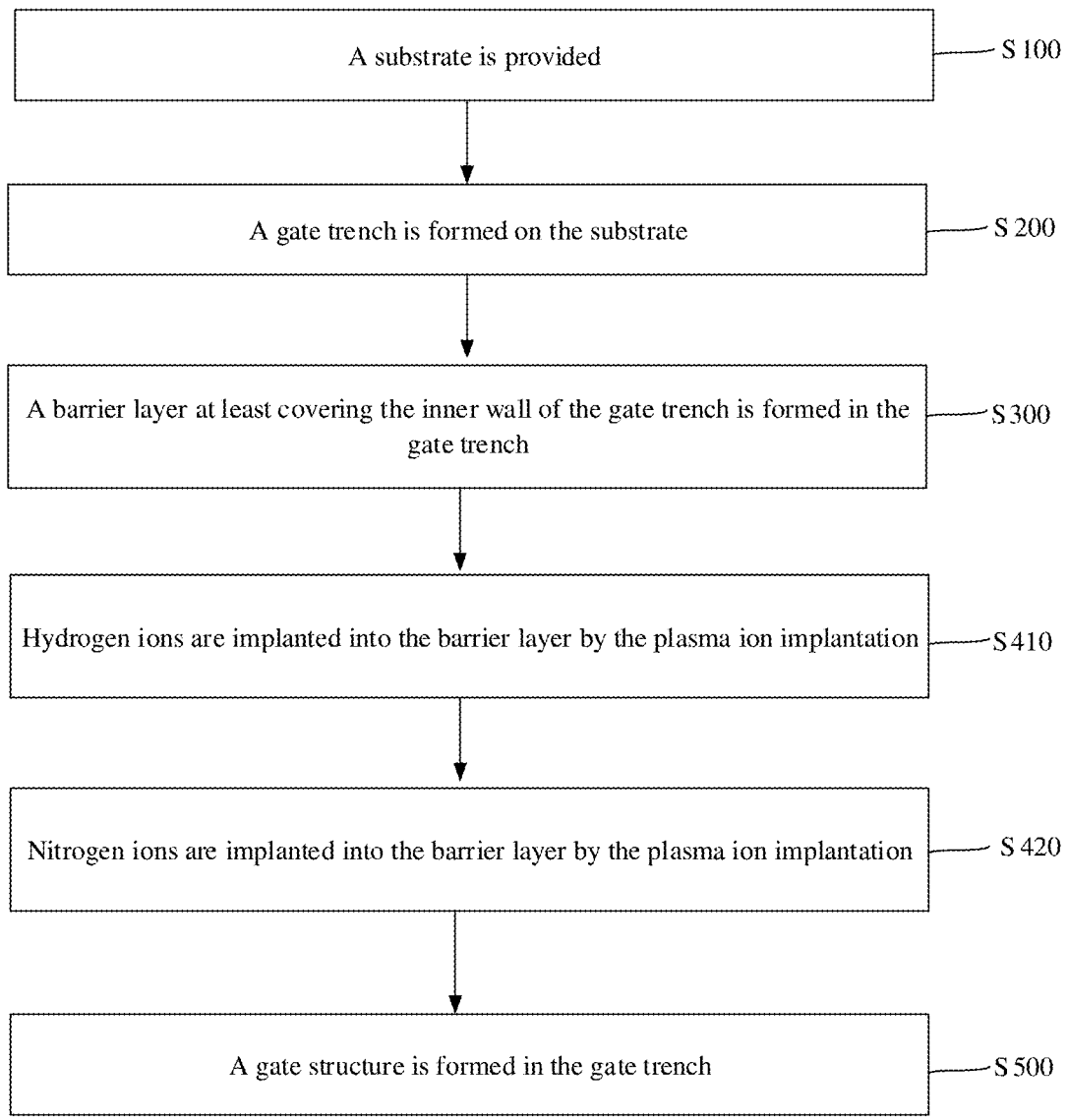
FIG. 4 is another flow chart of a method of manufacturing a semiconductor structure according to an embodiment of this disclosure.
Figure 5:
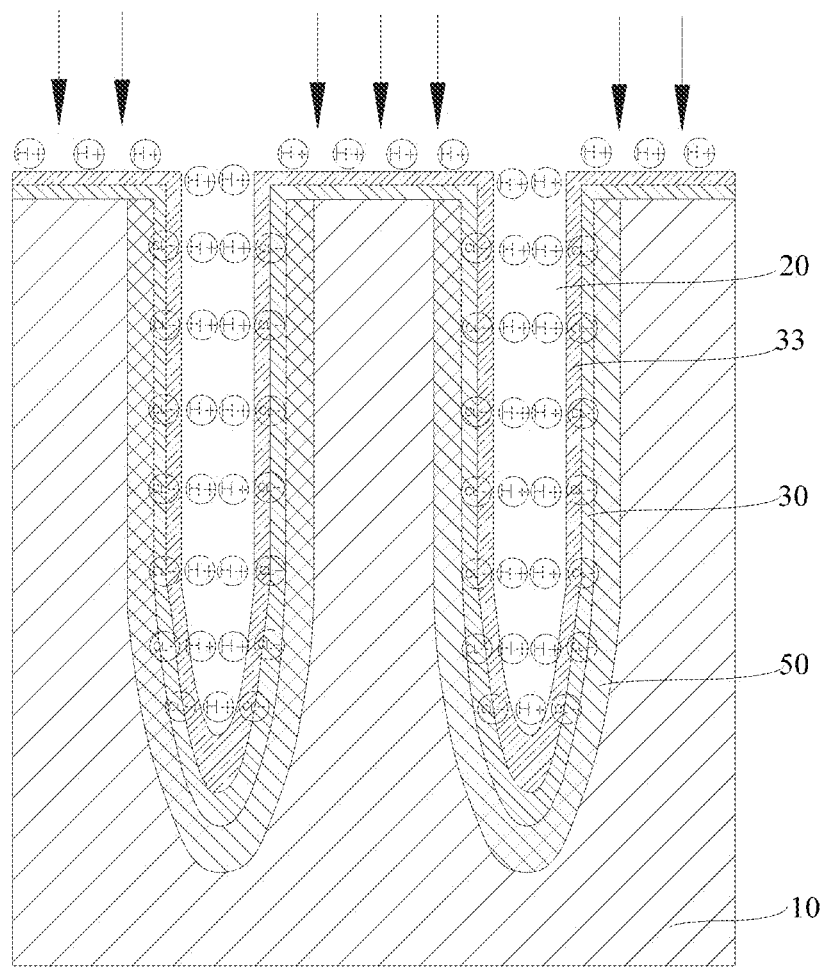
FIG. 5 is a schematic view showing the implanting of hydrogen ions into the barrier layer in a method of manufacturing a semiconductor structure according to an embodiment of this disclosure.
Figure 6:
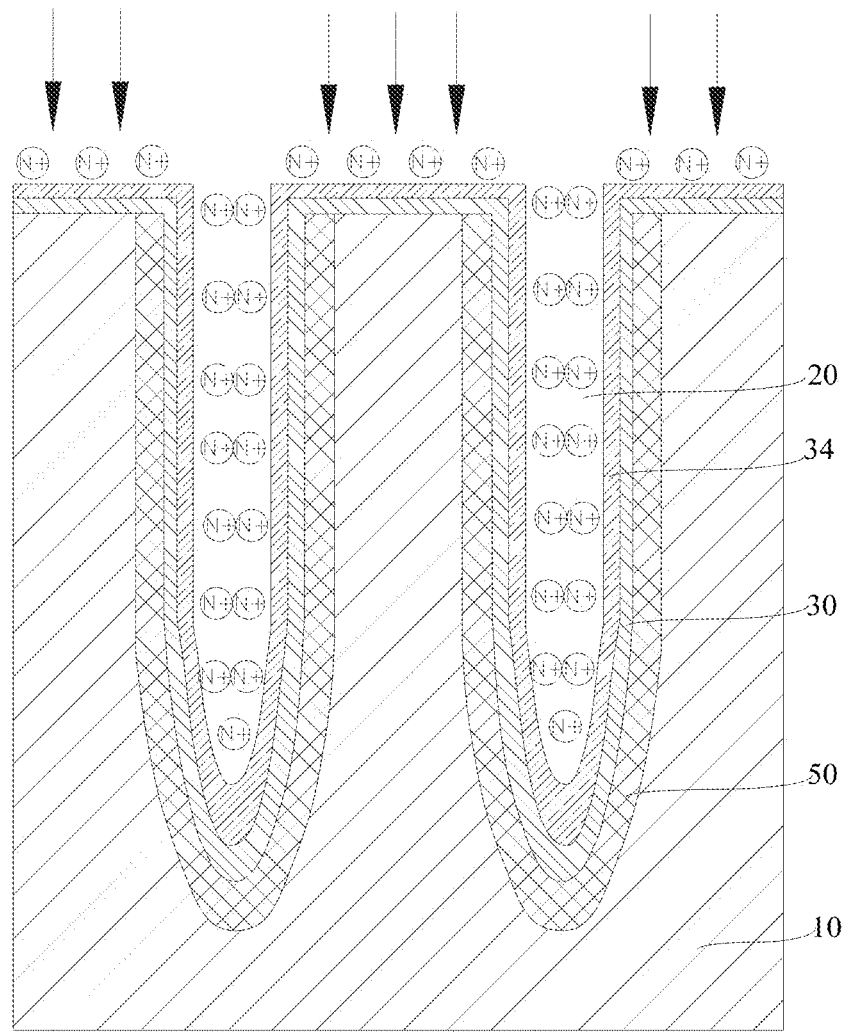
FIG. 6 is a schematic view showing the implanting of nitrogen ions into the barrier layer in a method of manufacturing a semiconductor structure according to an embodiment of this disclosure.

This operation may be performed in the following manner, as shown in FIG. 4 to FIG. 6.

In S410, hydrogen ions are implanted into the barrier layer by the plasma ion implantation.

Hydrogen ions are implanted into the barrier layer by the plasma ion implantation to form the structure as shown in FIG. 5. In other words, hydrogen ions 33 are deposited on the surface of the barrier layer 30, and the hydrogen ions 33 react with the chloride ions remaining in the barrier layer 30 to form a transition product. For example, in the case that the remaining chloride ions is in the form of titanium chloride, the hydrogen ions 33 are implanted into the gate trench 20 by the plasma ion implantation, and the transition product formed when the hydrogen ions 33 react with the titanium chloride is TiHCl.

In this embodiment, the implantation energy and implantation dose of the hydrogen ions 33 may be defined. For example, the implantation energy may be 2 KeV to 10 KeV, and the implantation dose of hydrogen ions may be $1 \times 10^{15}$ to $1 \times 10^{16}/cm^2$. In this embodiment, through the accurate control ability of the plasma ion implantation to the implantation energy and implantation dose of hydrogen ions, physical penetration is realized.

In S420, nitrogen ions are implanted into the barrier layer by the plasma ion implantation.

Nitrogen ions are implanted into the barrier layer by the plasma ion implantation to form the structure as shown in FIG. 6. In other words, nitrogen ions 34 are deposited on the surface of the barrier layer 30, the nitrogen ions 34 react with the transition product to form hydrogen chloride, and the hydrogen chloride escapes from the gate trench 20, so that the chloride ions remaining in the barrier layer 30 are discharged from the gate trench 20 in the form of hydrogen chloride, so as to realize the removal of the chloride ions remaining in the barrier layer 30.

For example, in the case that the transition product is TiHCl, the nitrogen ions 34 react with TiHCl to form titanium nitride and hydrogen chloride, and the hydrogen chloride escapes from the gate trench 20, and thus the chloride ions remaining in the barrier layer 30 is removed.

In this embodiment, the plasma implantation is used to remove the chloride ions remaining in the barrier layer 30 to prevent formation of defects inside the gate structure and reduce the resistance of the gate structure, thereby improving the performance of the semiconductor structure.

In the above operations, it is required to implant a large amount of nitrogen ions 34 the barrier layer 30, so that the barrier layer 30 forms a first barrier layer 31 and a second barrier layer 32, and the concentration of nitrogen ions in the first barrier layer 31 is different from the concentration of nitrogen ions in the second barrier layer 32. Compared with the situation before ion implantation, the concentration of nitrogen ions in at least a part of the barrier layer is increased, which can improve the barrier ability of the barrier layer 30 to prevent the conductive layer in the gate structure from diffusing into the substrate 10, thereby improving the performance of the gate structure.

It should be noted that the expression "the concentration of nitrogen ions in the first barrier layer 31 is different from the concentration of nitrogen ions in the second barrier layer 32" in this embodiment may indicate that, the concentration of nitrogen ions in the first barrier layer 31 is greater than the concentration of nitrogen ions in the second barrier layer 32, and may also be indicate that the concentration of nitrogen ions in the first barrier layer 31 is less than the concentration of nitrogen ions in the second barrier layer 32.

Figure 7:
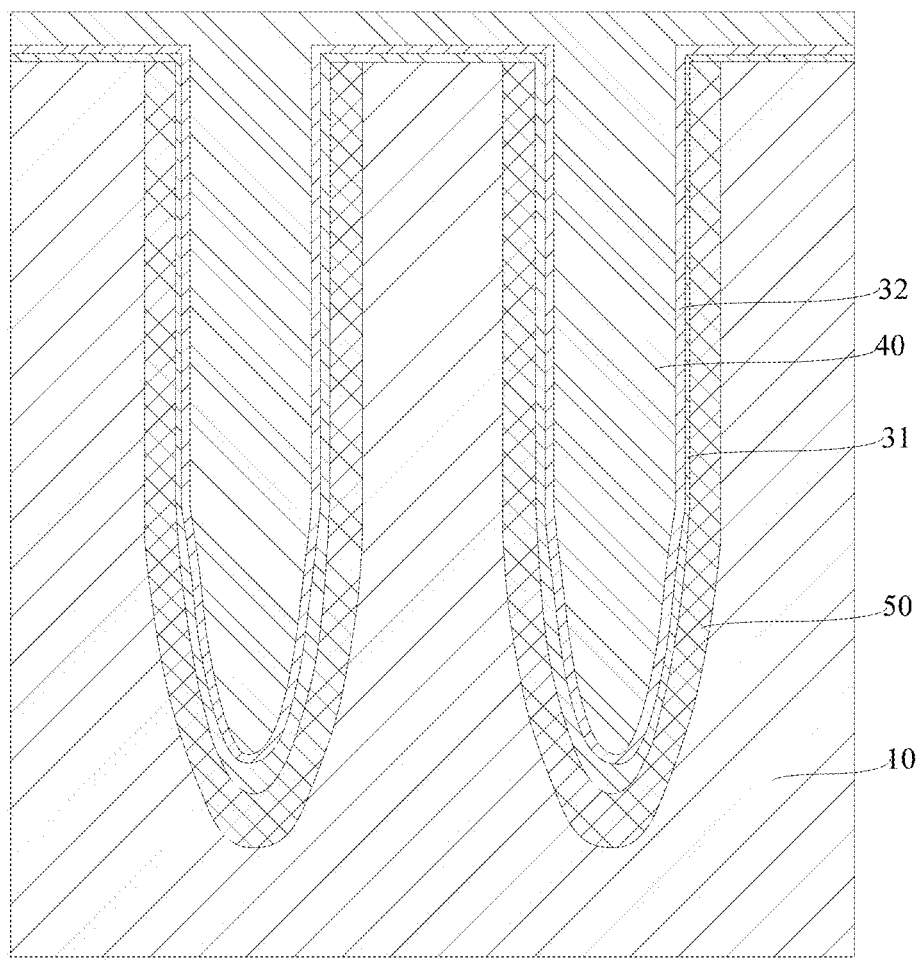
FIG. 7 is a schematic view showing the formation of a conductive layer in a method of manufacturing a semiconductor structure according to an embodiment of this disclosure.

Furthermore, in this embodiment, the plasma implantation is used to implant nitrogen ions 34 into the barrier layer 30. Compared with the technical solution without implanting nitrogen ions into the barrier layer 30, the concentration of nitrogen ions in at least a part of the region in the barrier layer formed in this embodiment is increased. For example, the concentration of nitrogen ions in the first barrier layer 31 may be increased, or the concentration of nitrogen ions in the second barrier layer 32 may be increased, or the concentration of nitrogen ions in both of the first barrier layer 31 and the concentration of nitrogen ions in the second barrier layer 32 may be increased In this embodiment, as shown in FIG. 7, the second barrier layer 32 may be located on the inner side of the first barrier layer 31. In other words, the first barrier layer 31 is in contact with the substrate 10, and the concentration of nitrogen ions in the second barrier layer 32 is greater than the concentration of nitrogen ions in the first barrier layer 31. In this way, the second barrier layer 32 with a higher concentration of nitrogen ions may be in direct contact with the gate structure, to prevent substances in the gate structure from diffusing into the substrate 10, thereby improving the performance of the semiconductor structure.

In this embodiment, the implantation energy and implantation dose of the nitrogen ions 34 may be defined. For example, the implantation energy may be 2 KeV to 10 KeV, and the implantation dose of nitrogen ions may be $1 \times 10^{15}$ to $1 \times 10^{16}/cm^2$.

In S500, a gate structure is formed in the gate trench, and the gate structure is filled in the gate trench.

This operation may be performed in the following manner.

In S510, a conductive layer is formed on the surface of the barrier layer, and the conductive layer covers the surface of the barrier layer. In other words, the shape of the conductive layer conforms to the shape of the barrier layer. The structure of the conductive layer is shown in FIG. 7.

In the case that the barrier layer 30 covers the inner wall of the gate trench 20, the conductive layer 40 also covers the inner wall of the gate trench 20. In the case that the barrier layer 30 covers the inner wall of the gate trench 20 and the surface of the substrate 10 located outside the gate trench 20, the conductive layer 40 also covers the inner wall of the gate trench 20 and the surface of the substrate 10 located outside the gate trench 20.

In this operation, a conductive layer 40 with a certain thickness may be formed on the surface of the barrier layer 30 by chemical vapor deposition or physical vapor deposition. The material of the conductive layer 40 may be metal tungsten (W).

Figure 8:
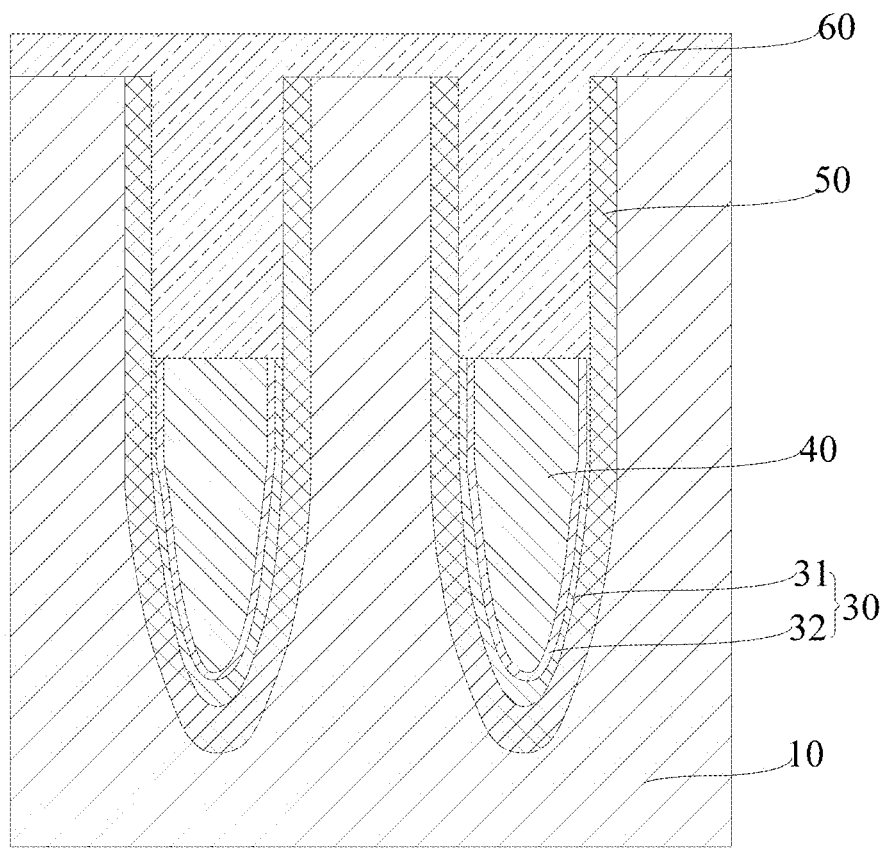
FIG. 8 is a schematic view showing the formation of a dielectric layer in a method of manufacturing a semiconductor structure according to an embodiment of this disclosure.

In S520, a part of the barrier layer and a part of the conductive layer are removed to form the gate structure, as shown in FIG. 8.

It should be understood that in this embodiment, a part of the barrier layer can be understood as a part of the barrier layer located in the gate trench, and can also be understood as the barrier layer located on the substrate and a part of the barrier layer located in the gate trench. The means of a part of the conductive layer is similar to the concept of a part of the barrier layer and thus is not repeated in this embodiment.

In other words, it is required to remove the barrier layer 30 and the conductive layer 40 located on the substrate 10 and a part of the barrier layer 30 and a part of the conductive layer 40 located in the gate trench 20, so that the top surface of the barrier layer 30 and the top surface of the conductive layer 40 are lower than the top surface of the substrate 10. Correspondingly, a part of the barrier layer and a part of the conductive layer remaining in the gate trench form the gate structure.

In some embodiments, after the operation of removing a part of the barrier layer and a part of the conductive layer to form the gate structure, the method further includes the following operation.

A dielectric layer is formed on the surface of the gate structure, and the dielectric layer extends to the surface of the substrate located outside the gate trench to form the structure as shown in FIG. 8.

In this operation, a dielectric layer 60 may be formed on the surface of the gate structure by chemical vapor deposition or atomic layer deposition, and the dielectric layer 60 extends to the surface of the substrate 10 located outside the gate trench 20. The material of the dielectric layer 60 may be silicon oxide or silicon nitride.

In some embodiments, after the operation of implanting nitrogen ions into the barrier layer by the plasma ion implantation, the method further includes the following operation.

Impurities remaining in the gate trench 20 are removed. The impurities are the impurities generated during the operation of implanting hydrogen ions and/or nitrogen ions into the barrier layer 30 by the plasma ion implantation.

In this embodiment, by removing the impurities remaining in the gate trench 20, these impurities can be prevented from increasing the resistance of the gate structure, thereby improving the performance of the semiconductor structure.

The operation of removing the impurities remaining in the gate trench may be performed as follows.

Figure 9:
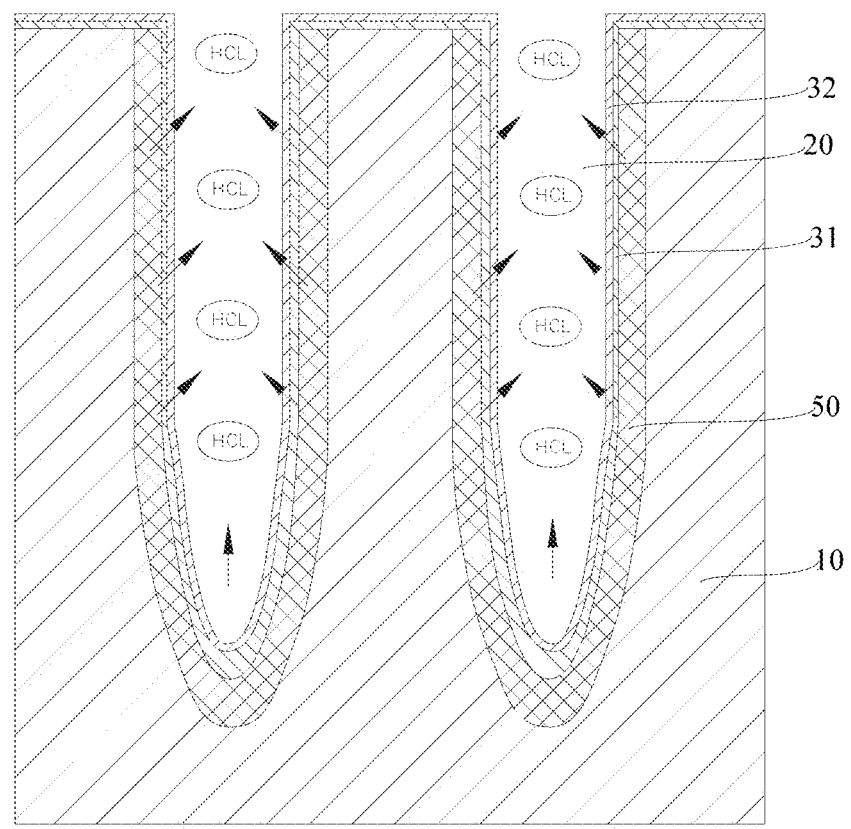
FIG. 9 is a schematic view showing the removal of the impurities in a method of manufacturing a semiconductor structure according to an embodiment of this disclosure.

As shown in FIG. 9, the semiconductor structure is treated by cleaning liquid and inert gases to remove the impurities remaining in the gate trench 20. Specifically, the cleaning water may be introduced into the gate trench 20 at first, and then impurities remaining in the gate trench 20 and on the surface of the barrier layer 30 are cleaned by the cleaning water; then, an inert gas, such as nitrogen gas, is introduced into the gate trench 20, and the hydrogen chloride in the gate trench 20 is discharged to the outside of the gate trench 20 through the inert gas.

In some embodiments, after the operation of removing the impurities remaining in the gate trench, the method further includes that rapid thermal annealing treatment is performed on the barrier layer.

The crystal lattices of the barrier layer 30 are prone to during the process of implanting hydrogen ions and/or nitrogen ions into the barrier layer 30, which affects the service life of the semiconductor structure. Therefore, in this embodiment, rapid thermal annealing treatment is performed on the barrier layer 30 to repair the crystal lattices of the barrier layer 30, thereby improving the performance of the semiconductor structure.

It should be noted that the rapid thermal annealing treatment mentioned in this embodiment refers to an annealing method in which the entire barrier layer 30 is heated to a temperature range of 400° C. to 1300° C. within a very short time.

As shown in FIG. 7, the embodiments of this disclosure further provide a semiconductor structure, including: a substrate 10, at least one gate trench 20, a barrier layer 30 and a conductive layer 40.

The gate trench 20 is arranged in the substrate 10. In an example, a plurality of gate trenches 20 may be formed and spaced apart from each other in the substrate. In this way, a plurality of gate structures may be formed in the substrate 10, so as to improve the practicability of the semiconductor structure.

The barrier layer 30 covers the inner wall of the gate trench 20, and no chloride ions remain in the barrier layer 30, so as to prevent formation of defects inside the gate structure and reduce the resistance of the gate structure, thereby improving the performance of the semiconductor structure.

The barrier layer 30 may include a first barrier layer 31 and a second barrier layer 32, and the concentration of nitrogen ions in the first barrier layer 31 is different from the concentration of nitrogen ions in the second barrier layer 32. The second barrier layer 32 may be located on the inner side of the first barrier layer 31. In other words, the first barrier layer 31 is in contact with the substrate 10, and the concentration of nitrogen ions in the second barrier layer 32 is greater than the concentration of nitrogen ions in the first barrier layer 31. In this way, the second barrier layer 32 with a higher concentration of nitrogen ions may be in direct contact with the gate structure to prevent substances in the gate structure from diffusing into the substrate 10, thereby improving the performance of the semiconductor structure.

The conductive layer covers the surface of the barrier layer 30 and is filled in the gate trench 20. The conductive layer 40 and the barrier layer 30 form a gate structure.

In some embodiments, a gate insulating layer 50 is arranged between the barrier layer 30 and the gate trench 20. In other words, a gate insulating layer 50 is arranged between the first barrier layer 31 and the side wall of the gate trench 20 and also between the first barrier layer 31 and the bottom wall of the gate trench 20, and the gate structure and the substrate 10 can be insulated from each other through the gate insulating layer 50.

Further, as shown in FIG. 8, the semiconductor structure further includes a dielectric layer 60. The dielectric layer 60 covers the surface of the gate structure and covers the surface of the substrate 10 located outside the gate trench 20. In other words, the dielectric layer 60 covers the substrate 10 and is filled in the gate trench 20, and the dielectric layer 60 located in the gate trench 20 is in contact with the gate structure.

Through the arrangement of the dielectric layer 60, the gate structure and other structures arranged on the substrate 10 can be insulated from each other. The material of the dielectric layer 60 may be silicon oxide or silicon nitride.

In this specification, each of the embodiments or implementation manners is described in a progressive manner, each of the embodiments focuses on the differences from other embodiments, and the same or similar parts between the embodiments can be referred to each other.

In the description of this specification, the description with reference to the terms "one implementation manner", "some implementation manners", "exemplary implementation manners", "examples", "specific examples", or "some examples", etc. means that the specific features, structures, materials or characteristics described with reference to the implementation manners or examples are involved in at least one implementation manner or example of this disclosure. In this specification, the schematic representation of the above terms does not necessarily refer to the same implementation manner or example. Moreover, the described specific features, structures, materials, or characteristics may be combined in any suitable manner in any one or more implementation manners or examples.

Finally, it should be noted that the above embodiments are only used to illustrate the technical solutions of this disclosure, but are not limited thereto. Although this disclosure is described in detail with reference to the above embodiments, it should be understood by those skilled in the art that the technical solutions recorded in the above embodiments may be modified, or some or all of the technical features may be equivalently replaced. However, the essence of the corresponding technical solutions does not depart from the scope of the technical solutions of the embodiments of this disclosure due to these modifications or replacements.

The invention claimed is:

1. A method of manufacturing a semiconductor structure, comprising:
   providing a substrate;
   forming at least one gate trench in the substrate;
   forming, in the at least one gate trench, a barrier layer at least covering an inner wall of the at least one gate trench;
   removing chloride ions remaining in the barrier layer by a plasma ion implantation to form a first barrier layer and a second barrier layer by the barrier layer, wherein the second barrier layer is located on an inner side of the first barrier layer, and a concentration of nitrogen ions in the second barrier layer is greater than a concentration of the nitrogen ions in the first barrier layer; and forming, a gate structure comprising the barrier layer and a conductive layer covering a surface of the barrier layer, in the at least one gate trench.

2. The method of manufacturing the semiconductor structure of claim 1, wherein the removing the chloride ions remaining in the barrier layer by the plasma ion implantation comprises:

implanting hydrogen ions into the barrier layer by the plasma ion implantation; and implanting the nitrogen ions into the barrier layer by the plasma ion implantation.

3. The method of manufacturing the semiconductor structure of claim 2, wherein after implanting the nitrogen ions into the barrier layer by the plasma ion implantation, the method further comprises:

removing impurities remaining in the at least one gate trench, wherein the impurities are generated during the plasma ion implantation of at least one of the hydrogen ions or the nitrogen ions into the barrier layer by the plasma ion implantation.

4. The method of manufacturing the semiconductor structure of claim 3, wherein the removing the impurities remaining in the at least one gate trench comprises:

treating the semiconductor structure by cleaning liquid and inert gases to remove the impurities remaining in the at least one gate trench.

5. The method of manufacturing the semiconductor structure of claim 4, wherein after removing the impurities remaining in the at least one gate trench, the method further comprises:

performing rapid thermal annealing treatment on the barrier layer.

6. The method of manufacturing the semiconductor structure of claim 1, wherein forming the at least one gate trench in the substrate comprises:

forming a photoresist layer on the substrate;

patterning the photoresist layer to form a mask pattern comprising a plurality of shielding regions and a plurality of opening regions arranged alternately; and removing a part of a depth of the substrate exposed from the plurality of opening regions to form a plurality of gate trenches spaced apart from each other in the substrate.

7. The method of manufacturing the semiconductor structure of claim 6, wherein after forming the at least one gate trench in the substrate and before forming the barrier layer in the at least one gate trench, the method further comprises:

forming, in the at least one gate trench, a gate insulating layer at least covering the inner wall of the at least one gate trench.

8. The method of manufacturing the semiconductor structure of claim 1, wherein the forming the gate structure comprising the barrier layer and the conductive layer covering the surface of the barrier layer in the at least one gate trench comprises:

forming, on the surface of the barrier layer, the conductive layer covering the surface of the barrier layer; and removing a part of the barrier layer and a part of the conductive layer to form the gate structure.

9. The method of manufacturing the semiconductor structure of claim 8, wherein after removing the part of the barrier layer and the part of the conductive layer to form the gate structure, the method further comprises:

forming, on a surface of the gate structure, a dielectric layer covering a surface of the substrate located outside the at least one gate trench.

10. A semiconductor structure, comprising:

a substrate;

at least one gate trench arranged in the substrate;

a barrier layer covering an inner wall of the at least one gate trench, wherein the barrier layer comprises a first barrier layer and a second barrier layer formed by performing a plasma ion implantation to the barrier layer to remove chloride ions remaining in the barrier layer, the second barrier layer is located on an inner side of the first barrier layer, and a concentration of nitrogen ions in the second barrier layer is greater than a concentration of the nitrogen ions in the first barrier layer; and a conductive layer covering a surface of the barrier layer, wherein the barrier layer and the conductive layer form a gate structure.

11. The semiconductor structure of claim 10, wherein a top surface of the gate structure is lower than a top surface of the substrate.

12. The semiconductor structure of claim 10, wherein a material of the conductive layer comprises tungsten.

13. The semiconductor structure of claim 12, wherein the semiconductor structure further comprises a dielectric layer covering a surface of the gate structure and covering a surface of the substrate located outside the at least one gate trench.

14. The semiconductor structure of claim 13, wherein a material of the dielectric layer comprises silicon oxide or silicon nitride.

15. The semiconductor structure of claim 10, wherein a gate insulating layer is arranged between the barrier layer and the at least one gate trench.

16. The semiconductor structure of claim 15, wherein a material of the gate insulating layer comprises at least one of silicon oxide, silicon nitride or silicon oxynitride.

* * * * *